United States Patent [19]

Benveniste et al.

[11] Patent Number: 4,914,305

[45] Date of Patent: Apr. 3, 1990

[54] UNIFORM CROSS SECTION ION BEAM SYSTEM

[75] Inventors: Victor M. Benveniste, Magnolia; Raymond P. Boisseau, Waltham, both of Mass.

[73] Assignee: Eaton Corporation, Cleveland, Ohio

[21] Appl. No.: 293,334

[22] Filed: Jan. 4, 1989

[51] Int. Cl.⁴ .............................................. H01J 37/00
[52] U.S. Cl. .................................. 250/492.3; 250/398
[58] Field of Search .............. 250/396 R, 398, 492.21; 313/360.1, 363.1

[56] References Cited

U.S. PATENT DOCUMENTS

| | | | |
|---|---|---|---|
| 3,795,833 | 3/1974 | King et al. | 250/396 R |
| 4,522,657 | 6/1985 | Rohatgi et al. | 437/24 |
| 4,578,589 | 3/1986 | Aitken | 250/281 |
| 4,724,328 | 2/1988 | Lischke | 250/396 R |

Primary Examiner—Bruce C. Anderson
Attorney, Agent, or Firm—Watts, Hoffmann, Fisher & Heinke

[57] ABSTRACT

An ion beam implant system having a source for producing multiple beamlets. The beamlets are emitted from the source and their intensity is controlled by an electrode array under control of a control apparatus. Downstream from the electrode array a resolving magnet shapes the beamlets and directs them to a region where they undergo further acceleration before impinging upon a workpiece. In a preferred technique, the workpiece is typically a silicon wafer and the ions are utilized for controlled doping of that wafer without need for ion beam scanning to selected portions of the workpiece or wafer movement through the ion beam during implantation.

8 Claims, 4 Drawing Sheets

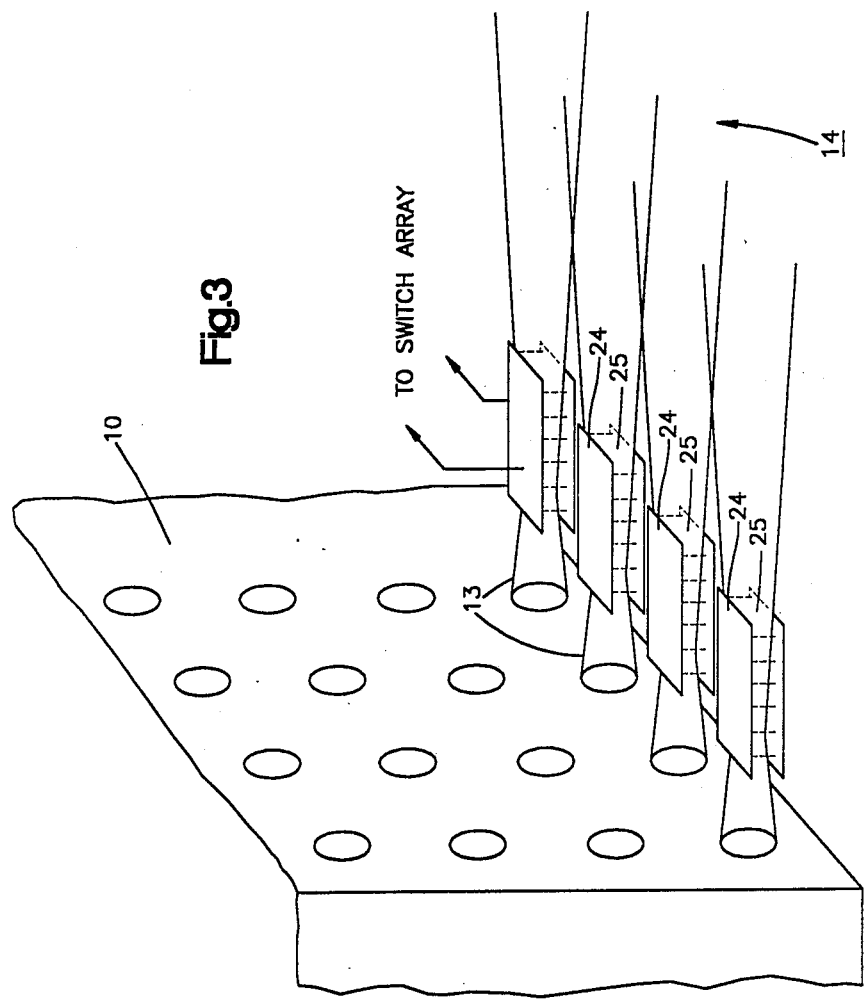

UNIFORM CROSS SECTION ION BEAM SYSTEM

TECHNICAL FIELD

The present invention relates to an ion beam system for treating a workpiece.

BACKGROUND ART

Ion beam treatment of workpieces such as silicon wafers for manufacture of semiconductor material is well-known in the prior art. Charged ions are created and accelerated to a specific velocity and caused to impinge upon a workpiece such as a silicon wafer. The prior art techniques for doping silicon wafers to produce semiconductor material are broadly divided into two classes of implanters.

High dose implanters typically use an ion source and focusing components for directing a high energy ion beam along a specified travel path. At an implant zone or station, the workpiece to be implanted is mechanically moved through the high energy ion beam in a controlled fashion to achieve uniform ion beam treatment of the workpiece. A U.S. prior art patent assigned to the Eaton Corporation which discloses and describes such a high energy ion implantation system is Ryding U.S. Pat. No. 4,234,797. This patent is incorporated herein by reference.

A second broad class of ion implantation systems use less intense ion beams which can be controllably deflected away from an initial trajectory to impinge upon different zones or areas at an implantation station. This type of lower intensity system also includes an ion beam source and focusing components for directing an ion beam along a specified trajectory. Along this trajectory, however, are positioned electric field creating electrodes which are energized in a controlled manner to deflect the ion beam away from the initial trajectory to the workpiece, typically a silicon wafer used in semiconductor manufacture. By controlling the voltage on the scanning electrodes, a uniform pattern of ion doping of the silicon wafer can be achieved. A representative U.S. patent disclosing a low energy ion implantation system is disclosed in Myron U.S. Pat. No. 4,736,107 which is also assigned to the Eaton Corporation and is incorporated herein by reference.

Each of the two broad classes of ion implantation systems have advantages and disadvantages. The high current ion beam implantation technique has generally resulted in reduced wafer throughput and required large, costly wafer handling stations to move the wafer through the ion beam.

Deflection scanning systems used with lower current ion beam implantation have advantages in size and simplicity but suffer a disadvantage due to the varying angle of beam incidence the ions impinge upon the wafer. This varying angle of incidence is due to the electrode scanning of the ion beam side to side across the surface of the silicon wafer.

DISCLOSURE OF THE INVENTION

One object of the present invention is an ion implantation system that combines the advantages of low and high current ion beam implanters and avoids some of the disadvantages of each type implanter.

An ion implantation system constructed in accordance with the present invention includes an ion source for providing a plurality of ion beams which collectively form the workpiece implantation beam. A number of beam deflection plates arranged in a matrix intercept and selectively deflect the ion beams to control ion beam intensity across the collective ion beam. The beam deflector plates of the invention are not used to cause the ions to be deflected to a particular region on the workpiece. They instead totally deflect the ions from the workpiece implantation beam. In this way the ion distribution from the ion source can be controlled to achieve a desired ion distribution at the workpiece surface.

A mass analyzer downstream from the deflection plates analyzes ions according to mass and also separates ions that have been deflected by the deflection plates away from the collective beam into a beam waist. Within the mass analyzer the beam envelope exhibits two distinct waists, one in the dispersive plane coincides with the resolving slit, another in the non-dispersive plane which is orthogonal to the dispersive plane coincides with a gating slit located for the purpose of intercepting deflected beamlets. Because beamlet deflections occur in the non-dispersive plane it will not interfere with the mass dispersion process. At a wafer treatment station, the wafers are placed in position to intercept ions exiting the mass analyzer.

An array of switches coupled to a control system biases deflection plates comprising the matrix and controls the ion distribution striking the wafer. This control system adjusts ion dosage impacting the wafer without need for sophisticated scanning electrodes and voltage control algorithms for those electrodes. It also avoids the necessity of mechanically scanning the wafers through an ion beam as required by prior art high current implanters.

BRIEF DESCRIPTION OF THE DRAWINGS

FIG. 3 is a depiction showing the relative position of deflection electrodes for deflecting ions away from initial trajectories the ions traverse as they exit the FIG. 2 beam source;

BEST MODE FOR CARRYING OUT THE INVENTION

Figure 1:
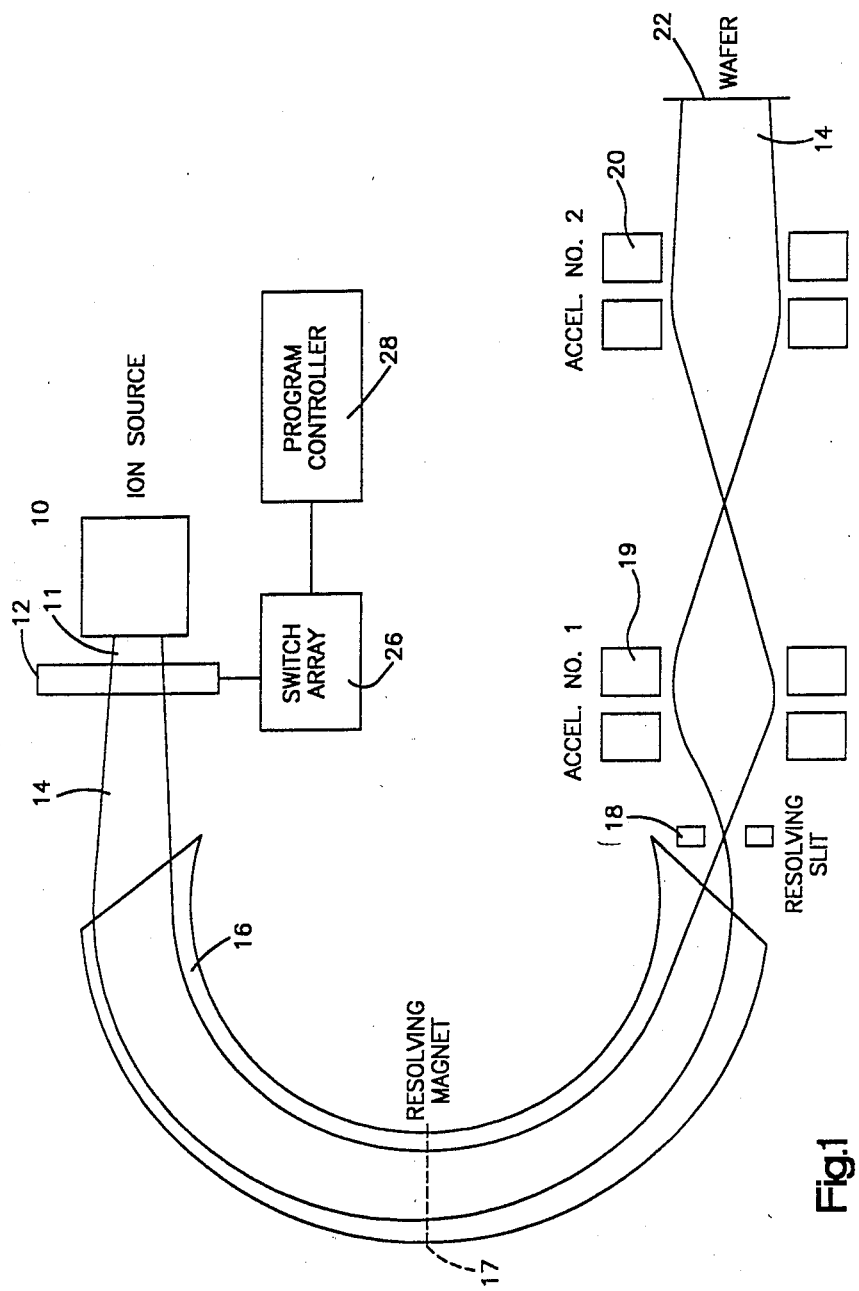
FIG. 1 is a schematic depiction an ion implantation system.
Figure 2:
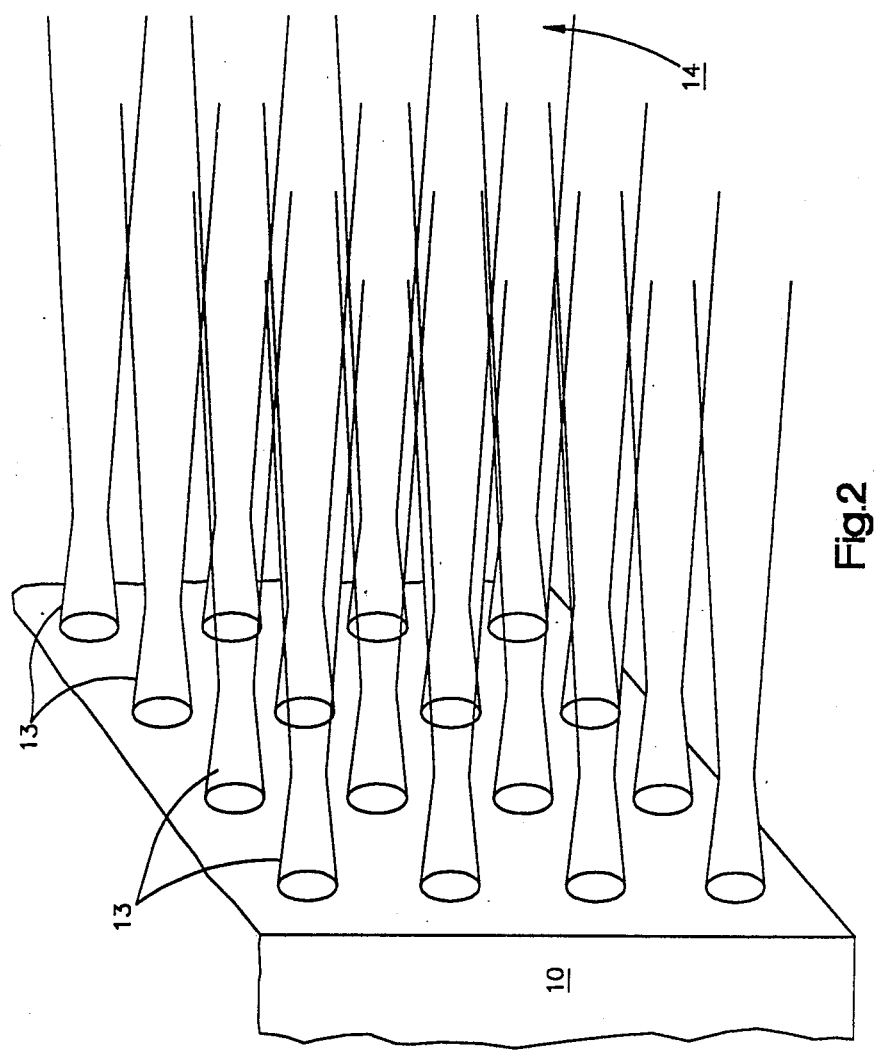
FIG. 2 is a perspective depiction of a beam source.

Turning now to the drawings, FIG. 1 depicts an ion implantation system including a low energy ($\sim$2 kv) ion source 10 for emitting ions that travel along a trajectory 11 passing through an ion distribution control 12. The source 10 emits a plurality of small cross section beams which diffuse as they move along the travel path and combine to form a beam 14. Individual beams within the beam 14 are referred to as "beamlets" 13 and are schematically depicted in FIG. 2.

The control 12 selectively adjusts the intensity of ions within the cross section of the ion beam 14 by controlled deflection of ions within a given beamlet 13 before they diffuse to form the combined beam 14.

The beam 14 passes through an analyzing or resolving magnet 16 where the ions are bent in a manner dependent upon their mass and charge. Downstream from the resolving magnet 16, the ions in the beam 14 enter a metallic resolving slit 18 that defines a beam waist in a dispersive plane. Ions deflected by the control 12 are removed from the beam 14 by a gating slit 17 approximately midway along the travel path through the magnet 16 which defines a beam waist in a non-dispersive plane. Those ions passing through the resolving slit are further accelerated by two accelerating tubes 19, 20 which accelerate the ions to a desired energy level (between 5 and 200 kv) and project the beam onto a workpiece 22. The two accelerating tubes 19, 20 act as a telescope and by controlling the size of the accelerating energy and distance along the beam path between the two tubes 19, 20 the size and angle of beam impact on the workpiece 22 are controlled.

The wafer 22 is moved to and from a proper position and orientation in the ion beam 14 by automatic wafer handling apparatus. Since the beam 14 is in a highly evacuated chamber from the source to the region of the wafer 22, this apparatus must move the wafers from atmospheric to very low pressure. Apparatus for accomplishing this task is known in the prior art.

The intensity control 12 selectively attenuates beamlets comprising the aggregate beam 14 to allow ion implantation dose at the workpiece 22 to be selectively controlled and typically made uniform. No wafer scanning at the implantation station is needed since the source 10 produces a large enough beam 14 to completely cover the implantation surface of the workpiece 20. Additionally, no scanning electrodes are needed and therefore the electronics needed to adjust the voltage on such electrodes are avoided.

In accordance with one embodiment of the invention, the source 10 is a multi-aperture Kaufman-type source capable of producing ions having an energy of approximately 1 kilovolt and currents of approximately 25 milliamps per centimeter. The specific source utilized in the embodiment shown in FIG. 1 includes a 3 centimeter diameter ion emitting area having 49 holes arranged in seven rows and seven columns with a total current capability of 125 milliamps.

The control 12 includes an array of electrodes which selectively deflect the ions from the beam. A representative sub-set of electrodes for part of a bottom row of beamlets is depicted in FIG. 3.

In accordance with this embodiment, two deflection plates 24, 25 are positioned on either side of each beamlet 13. A small voltage (about 10 volts) applied across the plates 24, 25 will deflect ions in the beamlet in an amount sufficient to cause the ions to be intercepted by the gating slit 17. A switching array 26 coupled to each pair of electrodes 24, 25 supplies the deflection voltage to the pair. By selective activation of the switching array under control of a programmable controller 28 the ion distribution across the beam 14 is adjusted. As an example, each pair of electrodes 24, 25 designated by electrode pair M, N when M and N refer to the row and column of the beamlet 13 are energized in turn for a controlled adjustable duration. This allows the ion dose to be both increased and decreased above and below a norm by adjusting the electrode energization interval.

The electrodes 24, 25 may be constructed to retain their charge between successive accesses or energizations. This produces a storage or memory which allows the array of electrodes to be scanned systematically using a conventional multi-plexer.

An alternate technique of accomplishing beamlet deflection uses electrodes that are interconnected along a given row or given column in an N×M matrix of electrodes. In this control scheme only a beamlet at the intersection of an activated row and column is substantially deflected. This scheme uses interleaved quadruple triplet lens arrangements above and below a beamlet trajectory. A representative quadruple triplet is depicted in FIG. 4.

Figure 4:
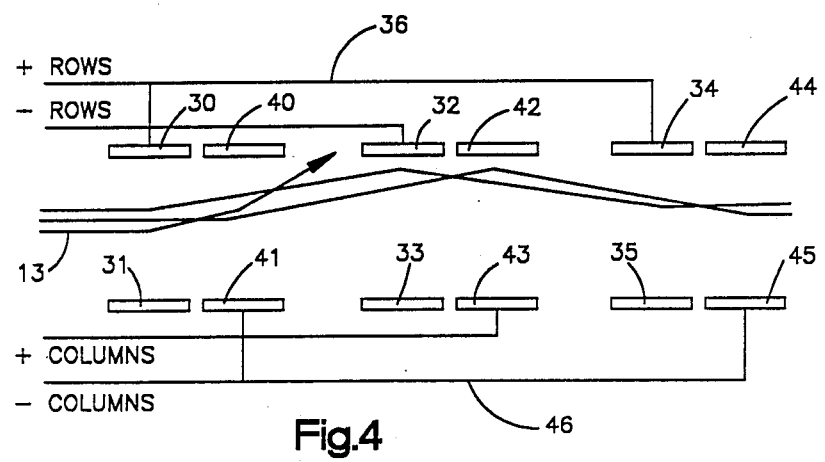
FIG. 4 is an elevation schematic view of an alternate set of deflection plates for deflecting ions away from their initial trajectory.

FIG. 4 depicts a beamlet 13 passing through twelve electrodes arranged as two quadruple triplet lenses. Six electrodes 30-35 form one quadruple lens which can be activated by electrically energizing the electrodes. In the depiction of FIG. 4, the two electrodes 30, 31 are electrically coupled together so that when the electrode 30 is activated so is the electrode 31. In addition, a conductor 36 connects the electrodes 30, 31 to the electrodes 34, 35.

Interleaved with the electrodes 30-35 are a set of six additional electrodes 40-45 which can also be activated under control of a switching array described below. In this second quadruple triplet the electrodes 40, 41 are electrically coupled to the two electrodes 44, 45 by the conductor 46. In summary, the electrodes 30-35 form a first quadruple lens which is interleaved with a second lens defined by the electrodes 40-45. Three possible trajectories of an ion beamlet 13 entering the interleaved quadruple lenses are depicted in FIG. 4. When only one of the quadruple lenses is activated (by energization of the electrodes that make up that lens), electrical fields are set up to cause a focusing of the ion beam back to an initial trajectory. If, however, both of the quadruple lenses are activated by suitable energizations described below, ions from this beamlet 13 are deflected to such an extent that the beamlet exits the beam 14 at the slit 18 (FIG. 1). This allows selective beam attenuation in a controlled manner described below in conjunction with a switch array for activating the interleaved quadruple triplets.

Figure 5:
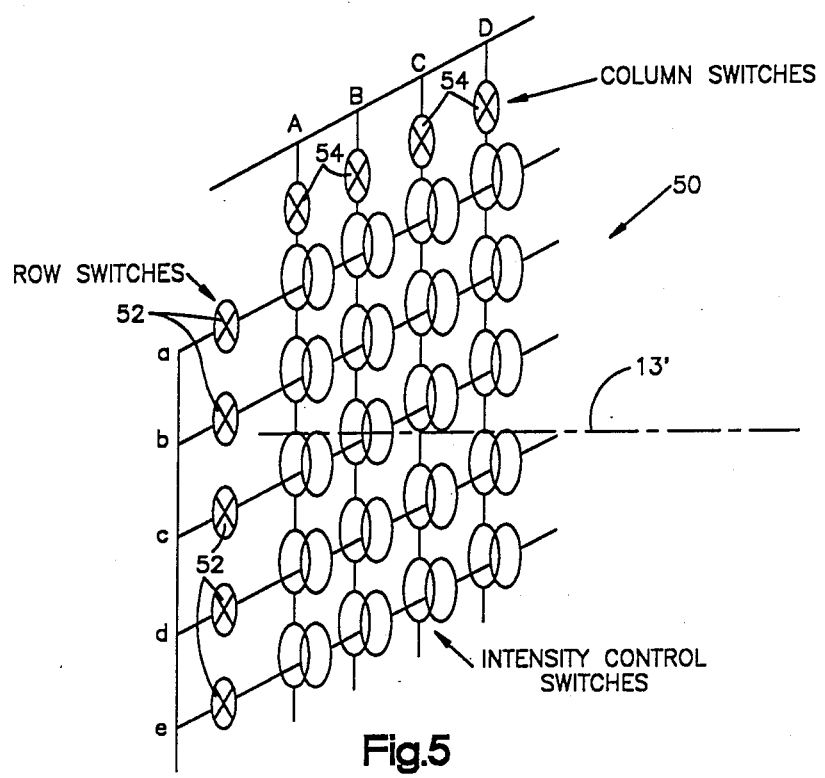
FIG. 5 is perspective view showing an array of electrode sites and activating circuitry for such an array.

FIG. 5 depicts a portion of an array 50 of quadruple pairs schematically depicted as ovals. It is appreciated that each oval corresponds to a triplet such as that depicted in FIG. 4. The array 50 is selectively activated by a number of switches 52, 54 which are designated as row switches and column switches in FIG. 5. In addition, each switch includes two switch contacts since both positive and negative voltages are routed to a given quadruple lens within the matrix array. Although five row switches and four column switches are depicted in FIG. 5, it is appreciated that for a source 10 that produces seven rows and seven columns of beamlets a total of 49 quadruple pairs are needed.

A representative beamlet 13 is seen passing through the quadruple lens pair identified as row "c", column "B". When neither switch 52c or 54B is closed or when one or the other of these two switches is closed ions that make up the beamlet will strike he wafer 22. To attenuate the beamlet 13' both switches 52c, 54B must be closed to energize all electrodes of the interleaved quadruple pair at the row c, column B matrix position.

The quadruple triplet pair at each matrix position is electrically coupled to all other matrix positions within a given row and column. This reduces the number of switches necessary to controllably activate the array 50. In a preferred embodiment wherein 49 beamlets are combined to form the ion beam, 14 switches, one for each row and one for each column, are needed to selectively activate the array 50 and control beam intensity of the beamlets passing through that array.

As noted above, the intersection of an activated switch combination attenuates the beamlet passing through that position and by controlling the time a given switch combination is active, the beam intensity for a given beamlet is controlled.

By sequentially scanning the matrix 50 at a fixed frequency, and pulsing each beamlet on and off at a different duty cycle, it is possible to attain a desired average intensity distribution required for uniform distribution at the workpiece 20.

In the merged beam technique depicted in FIG. 1, the magnet 16 focuses the individual beamlets forming the beam 14 into a single merged beam which is resolved through a single slit 18 and then accelerated as a single beam.

Certain advantages accompany use of this merged beam technique over a technique where each of the beamlets are resolved and accelerated. The resolving magnet gap is kept small since the source 10 itself is smaller in cross section. The common resolving slit 18 is easier to accomplish than would be multiple slits, one for each individual beamlet. Resolving and ion acceleration are achieved more easily since duplicate acceleration electrodes for each beamlet are not needed. In addition, the simplicity of the post acceleration apparatus results in fewer surfaces to accumulate condensates.

The utilization of a large cross sectional source which produces multiple beamlets results in a non-scanning, non-deflecting ion beam system for ion implantation of a workpiece. While a preferred embodiment of the invention has been described, it is the intent that the invention cover modifications from this embodiment falling within the spirit or scope of the appended claims.

We claim:

1. An ion implantation system having apparatus for defining an ion beam used in treating a wafer comprising:
   (a) an ion source for providing a plurality of relatively small cross section ion beams which combine to form a larger beam having a cross section on the order of a wafer surface to be treated;
   (b) an ion distribution control including a plurality of spaced beam electrodes that selectively deflect ions in the small cross section ion beams;
   (c) a magnet for analyzing ions leaving the intensity control and for directing certain ions to follow a wafer treatment trajectory;
   (d) a wafer treatment station for placing wafers in a position to intercept said certain ions after said ions exit the mass analyzer; and
   (e) switching means coupled to the ion distribution control for individually controlling biasing potentials of the beam electrodes to provide a controlled ion distribution of ions impacting a wafer surface at the wafer treatment station.

2. The ion implantation system of claim 1 wherein the ion distribution control comprises two electrodes spaced on either side of each small cross section ion beam and said switching means comprises an energy source to apply a potential different across said two electrodes.

3. The ion implantation system of claim 1 where the ion distribution control comprises an array of interleaved quadruple triplet electrodes wherein one set of quadruple triplet electrodes adjusts ion beam strength of each small cross section ion beam.

4. The apparatus of claim 1 further comprising means for accelerating ions exiting the magnet to a specified energy before the ions strike the wafer.

5. A method for treating a workpiece with an ion beam comprising the steps of:
   emitting ions from a plurality of apertures to form a plurality of small cross section ion beams that move along generally parallel trajectories and in combination form a larger cross section workpiece treatment beam;
   controllably deflecting ions in selected ones of the small cross section ion beams;
   intercepting the ions from the small cross section ion beams with a resolving magnet which bends the ions along a trajectory to cause the controllably deflected ions to be lost from the workpiece treatment beam; and
   accelerating ions exiting the resolving magnet that remain in the large cross section workpiece treatment beam to a controlled energy before those ions impact a stationary workpiece at a workpiece implantation station.

6. The method of claim 5 wherein the deflecting step is accomplished by selectively energizing electrodes positioned adjacent a small cross section ion beam.

7. The method of claim 5 wherein the accelerating step is accomplished in stages along a travel path of the large cross section beam subsequent to the resolving magnet.

8. The method of claim 6 wherein the step of energizing the electrodes is repeatedly performed for electrodes associated with all small cross section beams and a duty cycle of each electrode is adjusted to achieve a desired large cross section ion beam distribution across an implant surface of said workpiece.

* * * * *